United States Patent
Tavares et al.

(10) Patent No.: US 9,773,543 B1
(45) Date of Patent: Sep. 26, 2017

(54) EFFECTIVE CLAMSHELL MIRRORING FOR MEMORY INTERFACES

(71) Applicant: Xilinx, Inc., San Jose, CA (US)

(72) Inventors: Austin S. Tavares, San Jose, CA (US); Maria George, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/253,415

(22) Filed: Aug. 31, 2016

(51) Int. Cl.
  *G11C 5/06* (2006.01)
  *G11C 11/408* (2006.01)
  *G11C 11/4072* (2006.01)

(52) U.S. Cl.
  CPC ........ *G11C 11/408* (2013.01); *G11C 11/4072* (2013.01)

(58) Field of Classification Search
  CPC ........................ G11C 11/408; G11C 11/4072
  USPC ............................................................ 365/63
  See application file for complete search history.

(56) References Cited

U.S. PATENT DOCUMENTS

| | | | |
|---|---|---|---|
| 6,943,454 B1 * | 9/2005 | Gulachenski | G11C 5/02 257/777 |
| 6,961,231 B1 | 11/2005 | Alexander et al. | |
| 7,023,719 B1 * | 4/2006 | Hung | G11C 5/04 365/226 |
| 7,804,735 B2 * | 9/2010 | Mao | G06F 13/1684 365/230.03 |
| 7,822,886 B1 | 10/2010 | Miller et al. | |
| 8,229,725 B1 | 7/2012 | Ou et al. | |
| 8,244,933 B1 | 8/2012 | New | |
| 8,307,182 B1 | 11/2012 | Flateau, Jr. et al. | |
| 8,399,983 B1 | 3/2013 | New | |
| 8,438,326 B2 | 5/2013 | Helton | |
| 8,438,357 B1 | 5/2013 | Elkins et al. | |
| 9,001,608 B1 * | 4/2015 | Chishti | G11C 11/40611 365/149 |
| 9,520,160 B2 * | 12/2016 | Yoon | G11C 7/109 |

* cited by examiner

*Primary Examiner* — Pho M Luu

(57) ABSTRACT

Methods and apparatus are described for pinning out multiple memory devices using shared conductors therebetween and providing multiple chip select signals to indicate to which of the memory devices address signals on the shared conductors apply. In the case of a clamshell configuration with a top memory device having a corresponding bottom memory device and shared vias coupled therebetween, sharing two address signals for each shared via in this manner reduces the total number of vias used, thereby reducing routing congestion and enabling the addition of ground vias around the shared vias to reduce crosstalk for the address signals.

20 Claims, 5 Drawing Sheets

DDR4 Mapping

| Top Clamshell device | Bottom Clamshell device | pin directly under top clamshell device |
|---|---|---|
| A0 | A1 | |
| A1 | A0 | |
| A2 | A9 | |
| A3 | A4 | |
| A4 | A3 | |
| A5 | A6 | |
| A6 | A5 | |
| A7 | A8 | |
| A8 | A7 | |
| A9 | A2 | |
| A10 | A10 | Multi-purpose - Auto Precharge |
| A11 | A13 | |
| A12 | A12 | Multi-purpose - Burst Chop |
| A13 | A11 | |
| A14 | A14 | Multi-purpose – WE_n |
| A15 | A15 | Multi-purpose - CAS_n |
| A16 | A16 | Multi-purpose - RAS_n |
| BA0 | BA1 | |
| BA1 | BA0 | |
| BG0 | BG1 | |
| BG1 | BG0 | |

DDR3 Mapping

| Top Clamshell device | Bottom Clamshell device | pin directly under top clamshell device |
|---|---|---|
| A0 | A0 | A12 (Multi-purpose) |
| A1 | A2 | |
| A2 | A1 | |
| A3 | A3 | BA1 (Bank Address) |
| A4 | A5 | |
| A5 | A4 | |
| A6 | A7 | |
| A7 | A6 | |
| A8 | A8 | RESET# |
| A9 | A11 | |
| A10 | A10 | Multi-purpose - Auto Precharge |
| A11 | A9 | |
| A12 | A12 | Multi-purpose - Burst Chop |
| A13 | A14 | |
| A14 | A13 | |
| A15 | A15 | BA2 (Bank Address) |
| BA0 | BA0 | VREFCA |
| BA1 | BA1 | A3 (Row/Column Address) |
| BA2 | BA2 | A15 (Row/Column Address) |

EFFECTIVE CLAMSHELL MIRRORING FOR MEMORY INTERFACES

TECHNICAL FIELD

Examples of the present disclosure generally relate to memory integrated circuits (ICs) and, more particularly, to addressing memory ICs using conductors shared therebetween.

BACKGROUND

Several different types of random-access memory (RAM) exist and are suitable for different purposes. Dynamic random-access memory (DRAM) is a type of RAM that stores each bit of data in a separate capacitor using a corresponding transistor. The capacitor can be either charged or discharged, and these two capacitor states may represent logical high or low values, respectively. Because the capacitors will slowly discharge in current implementations due to transistor leakage, the capacitor charge is refreshed periodically, which leads to the term "dynamic" in the name DRAM. DRAM is a volatile memory since data stored in the capacitors is lost quickly when power is removed and is widely used as the main memory in modern computers.

One type of DRAM is referred to as synchronous dynamic random-access memory (SDRAM). SDRAM has a synchronous interface coordinated by an externally supplied clock signal. SDRAM may be divided into several independent sections of memory referred to as "banks," allowing an SDRAM to operate on several memory access commands concurrently, provided the commands are independent of each other (e.g., interleaved). This division into banks allows SDRAMs to achieve more concurrency and higher data rates than asynchronous DRAMs.

SUMMARY

Examples of the present disclosure generally relate to using shared conductors (e.g., shared vias and/or traces) between multiple memory integrated circuits (ICs) and multiple chip select signals for determining to which memory IC one or more address bits refer.

One example of the present disclosure is a circuit board. The circuit board generally includes a first plurality of conductor pads arranged for a first memory IC, wherein the first plurality of conductor pads is located on a first surface of the circuit board; a second plurality of conductor pads arranged for a second memory IC, wherein the second plurality of conductor pads is located on a second surface of the circuit board; a first set of one or more shared vias, wherein each shared via is coupled to at least one of the first plurality of conductor pads, to at least one of the second plurality of conductor pads, and to a first trace for receiving an address signal; a second trace coupled to the first plurality of conductor pads for receiving a first select signal for indicating that the address signal applies to the first memory IC; and a third trace coupled to the second plurality of conductor pads for receiving a second select signal for indicating that the address signal applies to the second memory IC.

Another example of the present disclosure is an apparatus. The apparatus generally includes a circuit board having a first surface and a second surface, a first memory IC located adjacent the first surface, and a second memory IC located adjacent the second surface. The circuit board generally includes a first set of one or more shared vias, wherein each shared via is coupled to the first memory IC, to the second memory IC, and to a first trace for receiving an address signal; a second trace coupled to the first memory IC for receiving a first select signal for indicating that the address signal applies to the first memory IC; and a third trace coupled to the second memory IC for receiving a second select signal for indicating that the address signal applies to the second memory IC.

Yet another example of the present disclosure is a method of addressing a plurality of memory ICs. The method generally includes outputting a first select signal to a first memory IC and outputting an address signal to a shared conductor coupled to the first memory IC and to a second memory IC, wherein the first select signal indicates whether the address signal applies to the first memory IC and wherein a second select signal indicates whether the address signal applies to the second memory IC.

These and other aspects may be understood with reference to the following detailed description.

BRIEF DESCRIPTION OF THE DRAWINGS

So that the manner in which the above-recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

DETAILED DESCRIPTION

Examples of the present disclosure provide techniques and apparatus for pinning out multiple memory devices using shared conductors therebetween and providing multiple chip select signals (CS_n) to indicate to which of the memory devices address signals on the shared conductors apply. In the case of a clamshell configuration with a top memory device having a corresponding bottom memory device and shared vias coupled therebetween, sharing two address signals for each shared via in this manner reduces the total number of vias used, thereby reducing routing congestion and enabling the addition of ground vias around the shared vias to reduce crosstalk for the address signals.

Example Memory Architecture

Figure 1:
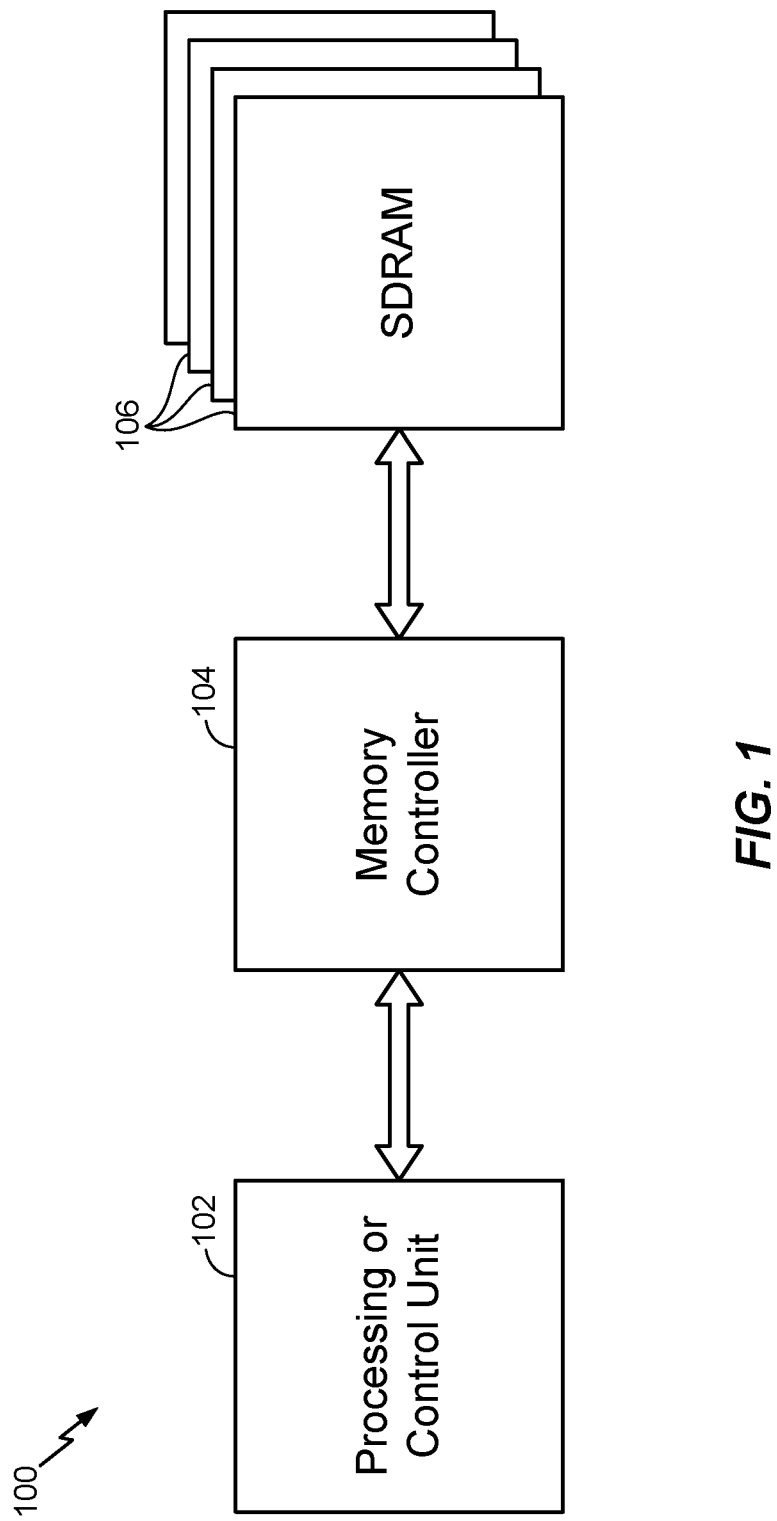
FIG. 1 is a block diagram illustrating an example system using synchronous dynamic random-access memory (SDRAM), in accordance with an example of the present disclosure.

FIG. 1 is a block diagram illustrating an example system 100 using synchronous dynamic random-access memory (SDRAM), in accordance with an example of the present disclosure. The system 100 includes a processing or control unit 102, a memory controller 104, and one or more SDRAM devices 106. The processing or control unit 102 may be, for example, a central processing unit (CPU) or a direct memory access (DMA) controller. The memory controller 104 may control the SDRAM devices 106 via an interface 108, which may include, for example, clock, chip select, address, and data signals. The SDRAM devices 106 may include any of various suitable SDRAM devices, such as double data rate, third generation (DDR3) or double data rate, fourth generation (DDR4) SDRAM devices. For some examples, the SDRAM devices 106 may be included in one or more memory modules, which may be inserted into respective receptacles on a motherboard connected to the memory controller 104 and the processing or control unit 102. For some examples, the SDRAM devices 106 on the memory modules may be arranged using a clamshell design, with SDRAM devices on the upper surface of a circuit board having corresponding SDRAM devices on the lower surface of the circuit board.

Clamshell memory configuration may be used when routing density is a factor. By placing the memory components (e.g., the SDRAM devices 106) on the top and bottom of the circuit board, the total area is significantly reduced by a factor of nearly 2×. When using this clamshell approach, the pins of the corresponding top and bottom memory components may not match. Ideally, the pins of the corresponding clamshell memory components should be mirrored to have a specific address line for the top component match the bottom component. Some memory standards are designed for this type of configuration and have a mirroring feature built into the components (e.g., reduced latency dynamic random-access memory (RLDRAM)). However, certain memory standards (e.g., DDR3 and DDR4) do not currently have such a mirroring feature natively.

Furthermore, when designing circuit boards for memory interfaces (e.g., memory modules), it is desirable to provide a large number of ground (GND) vias for return paths to enhance signal integrity for the memory components' signals. One method to add the additional GND connections is to create a routing channel (e.g., a row of GND vias inserted between two rows of address pins) to add GND when breaking out the signals. This routing channel method is not possible with certain clamshell configurations due to the lack of a built-in mirroring feature. Instead, with these configurations, the signal vias are typically placed in the middle between the two rows of solder balls. This signal via placement causes a significant amount of crosstalk on the address signals because multiple address signals may share a common GND return path.

Moreover, with increasing data rates, signal integrity is becoming a larger concern. With the current speeds of DDR4, address is becoming the bus with the least margin, even though address is single data rate (SDR). This is due to the multiple loads in the fly-by topology and the lack of return current paths at the memory components. Therefore, additional GND return paths are desired to meet the eye mask specifications of the memory components. While there are some board configurations that do not demand the additional GND vias, the solution space is becoming smaller and smaller. One example is thin boards with the memory address buses routed on the top layers to reduce the z-direction coupling and with a small number of devices.

Example Clamshell Mirroring

In order to reduce crosstalk on address signals in the clamshell configuration, the routing congestion may be reduced. This can be accomplished by effectively adding the mirroring feature externally in the memory controller 104 (as opposed to natively with the memory devices themselves) and by using two chip select (CS_n) pins.

Figure 2:
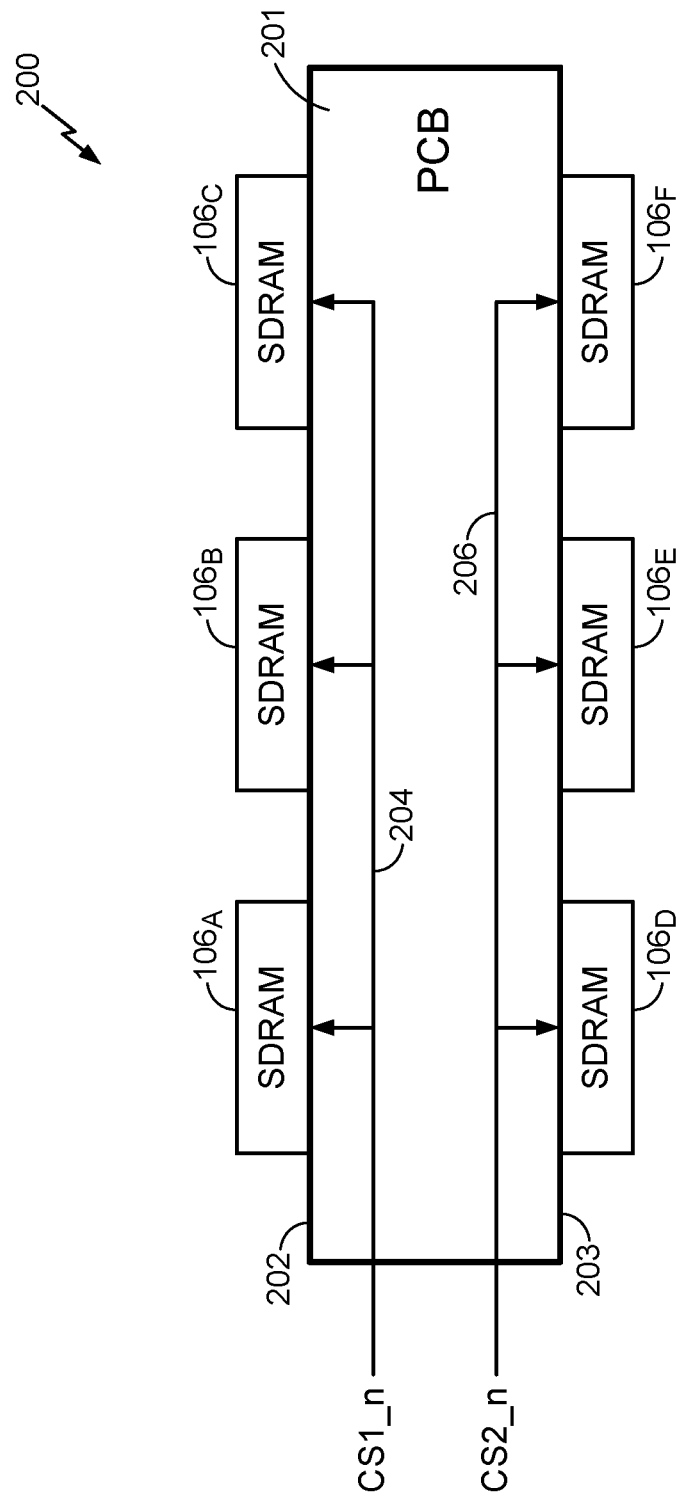
FIG. 2 is a conceptual diagram illustrating an example memory module with two chip select signals, in accordance with an example of the present disclosure.

FIG. 2 is a conceptual diagram illustrating an example memory module 200, in accordance with an example of the present disclosure. The memory module 200 includes a printed circuit board (PCB) 201 having an upper surface 202 and a lower surface 203. The memory module 200 implements the clamshell configuration by having corresponding SDRAM devices 106 on the top and bottom of the PCB 201. The SDRAM devices $106_A$, $106_B$, and $106_C$ disposed above the upper surface 202 of the PCB 201 have corresponding SDRAM devices $106_D$, $106_E$, and $106_F$, respectively, disposed below the lower surface 203 of the PCB 201.

The PCB 201 includes two traces 204, 206 for receiving two chip select signals (CS1_n and CS2_n) from the memory controller 104, for example, and distributing these signals to the various SDRAM devices 106. For some examples, one CS_n signal (e.g., CS1_n) would be common to all the devices on the top, and the other CS_n signal (e.g., CS2_n) would be common to all the devices on the bottom. For other examples, additional chip select signals may be used in multiples of two. In this manner, two SDRAM devices may share a conductor (e.g., a via or a trace) for receiving an address signal, and the two chip select signals indicate whether the address signal is intended for one of the SDRAM devices or the other. In the case of a clamshell configuration, the upper SDRAM device and the corresponding lower SDRAM device on either side of the PCB 201 (e.g., SDRAM devices $106_A$ and $106_D$) may be coupled together via one or more shared vias disposed in the PCB, and each shared via may correspond to different memory address bits in the two SDRAM devices for certain memory standards without native mirroring.

Figures 3, 4:
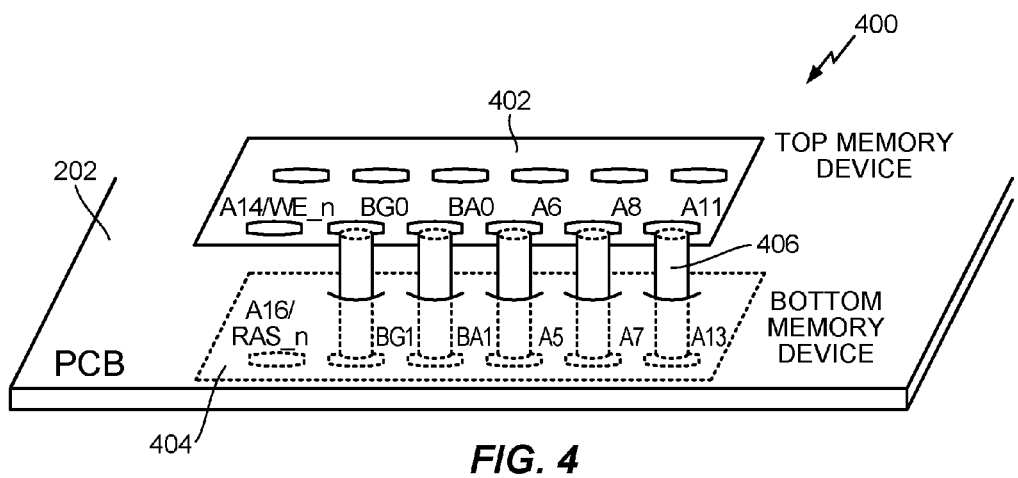
FIG. 3 is an example table for mirroring double data rate, fourth generation (DDR4) SDRAM devices, in accordance with an example of the present disclosure.
FIG. 4 is a conceptual diagram of an example memory module illustrating shared vias between top and bottom DDR4 SDRAM devices based on the table of FIG. 3, in accordance with an example of the present disclosure.

The DDR4 address mapping for the top and bottom clamshell devices is shown in table 300 of FIG. 3, illustrating the top DDR4 device address bit which is paired with and routed to the bottom DDR4 device address bit. Note that address bits A10, A12, A14, A15, and A16 may be routed separately to both top and bottom devices because these address bits are multi-purpose bits (i.e., used for more than just memory addressing, such as control signals). For example, during DDR4 write and read commands, the logic level on address bit A10 indicates if Auto Precharge should be performed to the accessed bank after the read or write operation. The logic level on address bit A12 indicates if burst chop (on-the-fly) will be performed during the read or write operation. Address bits A14, A15, and A16 are treated as command signals when the activate signal (ACT_n) is a logic high and CS_n (either CS1_n or CS2_n) is a logic low. Address bits A14, A15, and A16 may be treated as row address inputs when ACT_n and CS_n are both logic low.

A single PCB via may be used from the top DDR4 memory device to the bottom DDR4 memory device for each of address bits A0 to A9, A11, and A13; bank address bits BA0 to BA1; and bank group bits BG0 to BG1. In DDR4, the two bank address bits and the two bank group bits provide four bank select bits for selecting up to 16 different banks within each DDR4 memory device. FIG. 4 is a conceptual diagram of a portion of an example memory module 400 illustrating shared vias 406 between a top DDR4 SDRAM device 402 and a bottom DDR4 SDRAM device 404 based on the table 300 of FIG. 3, in accordance with an example of the present disclosure. For example, a shared via 406 is used to connect A11 on the top device 402 to A13 on the bottom device 404. The traces for receiving chip select signals are not shown in FIG. 4 to avoid cluttering the illustration, but these may be implemented similar to traces 204 and 206 in FIG. 2. Using the shared vias 406 reduces the amount of routing vias used (e.g., by about 37%) compared to using a separate via for each address pin on both DDR4 devices, thereby reducing congestion and enabling the addition of ground (GND) vias to reduce crosstalk for the address signals.

Figures 5, 6:
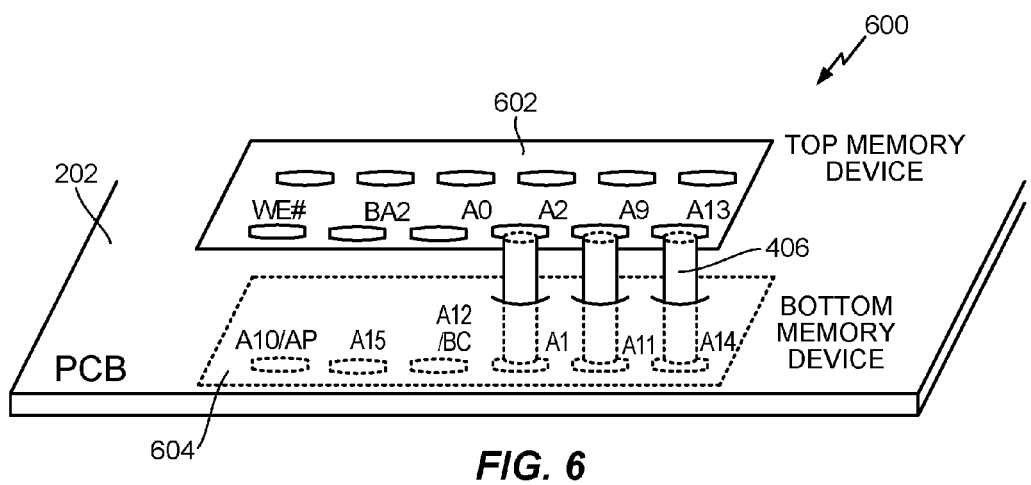
FIG. 5 is an example table for mirroring double data rate, third generation (DDR3) SDRAM devices, in accordance with an example of the present disclosure.
FIG. 6 is a conceptual diagram of an example memory module illustrating shared vias between top and bottom DDR3 SDRAM devices based on the table of FIG. 5, in accordance with an example of the present disclosure.

Table 500 of FIG. 5 shows the DDR3 address mapping for the top and bottom clamshell devices, illustrating the top DDR3 device address bit which is paired with and routed to the bottom DDR3 device address bit. Note that address bits A10 and A12 may have to be routed to both top and bottom devices because these bits are multi-purpose bits. For example, during DDR3 write and read commands, the logic level on address bit A10 indicates if Auto Precharge should be performed to the accessed bank after the read or write operation. The logic level on address bit A12 indicates if burst chop (on-the-fly) will be performed during the read or write operation. Address bits A0, A3, A8, and A15 and bank address bits BA0, BA1, and BA2 may be routed separately to both top and bottom devices because these bits land on non-address pins, multi-purpose address pins, or bank address pins, as illustrated in the third column of table 500.

As described above, a single PCB via can be used from the top DDR3 memory device to the bottom DDR3 memory device for each of address bits A1, A2, A4 to A7, A9, A11, A13, and A14. FIG. 6 is a conceptual diagram of a portion of an example memory module 600 illustrating shared vias 406 between a top DDR3 SDRAM device 602 and a bottom DDR3 SDRAM device 604 based on the table 500 of FIG. 5, in accordance with an example of the present disclosure. For example, a shared via 406 is used to connect A13 on the top device 602 to A14 on the bottom device 604. The traces for receiving chip select signals are not shown in FIG. 6 to avoid cluttering the illustration, but these may be implemented similar to traces 204 and 206 in FIG. 2. Using the shared vias 406 reduces the amount of routing vias used (e.g., by about 26%) compared to using a separate via for each address pin on both DDR3 devices, thereby reducing congestion and enabling the addition of ground (GND) vias to reduce crosstalk for the address signals.

According to some examples, the two (or more) chip select signals (CS_n) may be utilized to perform a memory initialization sequence. Memory initialization may involve writing to mode registers in the memory device to set parameter values for proper functionality. Memory initialization may be performed sequentially to the memory devices with shared conductors (e.g., top and bottom devices with shared vias) because the address bits are used for setting the parameter values. Any calibration stage that involves mode register writes like write leveling and multipurpose register (MPR) read leveling may also entail sequential mode register writes to the paired memory devices using the two CS_n signals (e.g., first one device of the pair using one CS_n, and then the other device using the other CS_n signal).

Example Operations for Addressing Memory ICs

Figure 7:
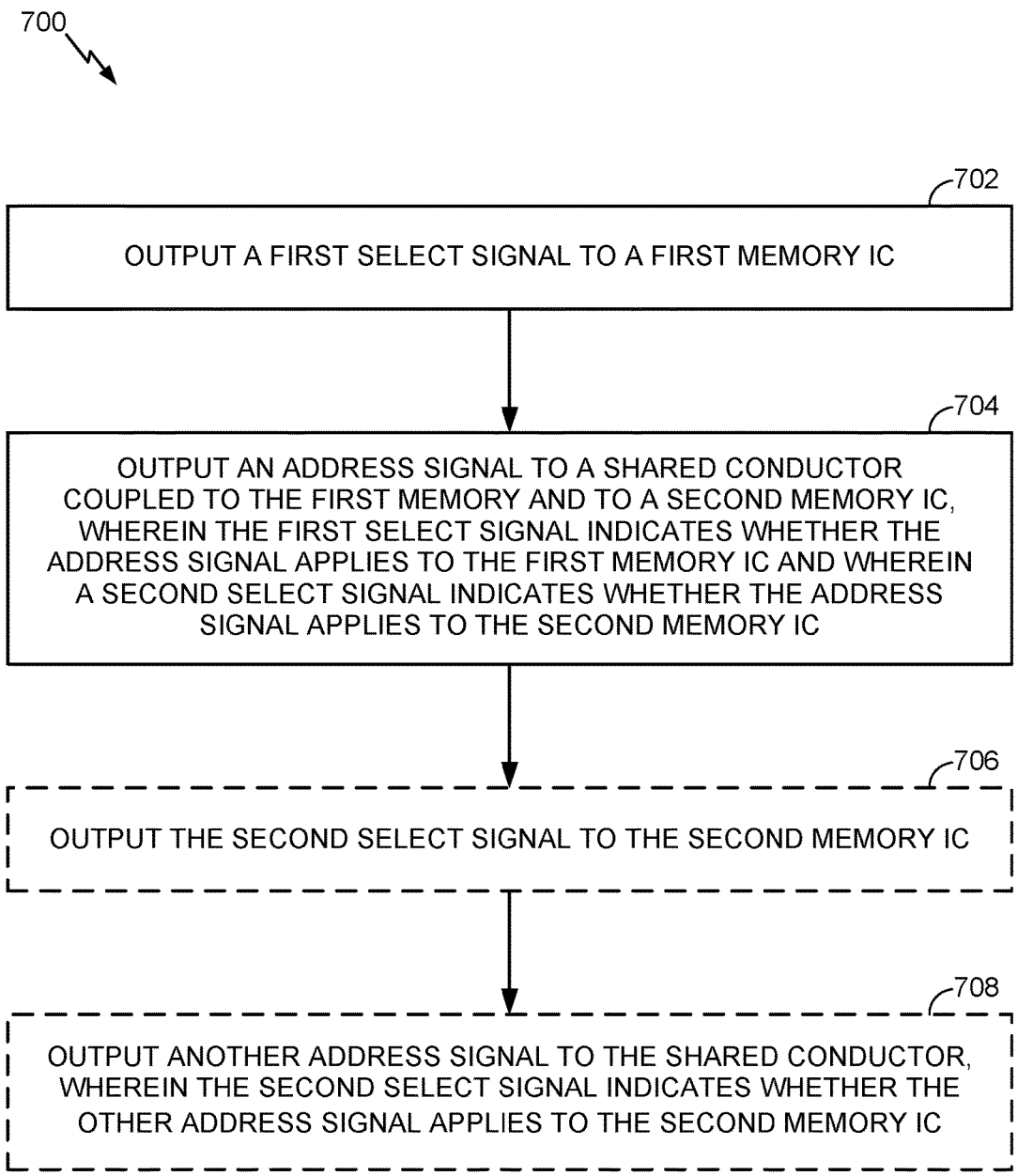
FIG. 7 is a flow diagram of example operations for addressing a plurality of memory ICs, in accordance with an example of the present disclosure.

FIG. 7 is a flow diagram of example operations 700 for addressing a plurality of memory ICs, in accordance with an example of the present disclosure. The operations 700 may be performed, for example, by an apparatus (e.g., memory controller 104).

The operations 700 may begin, at block 702, with the apparatus outputting a first select signal to a first memory IC. At block 704, the apparatus may output an address signal to a shared conductor coupled to the first memory IC and to a second memory IC. The first select signal indicates whether the address signal applies to the first memory IC, and a second select signal indicates whether the address signal applies to the second memory IC.

According to some examples, the operations 700 may further entail the apparatus outputting the second select signal to the second memory IC at optional block 706. At optional block 708, the apparatus may output another address signal to the shared conductor. In this case, the second select signal indicates whether the other address signal applies to the second memory IC.

According to some examples, the first memory IC is located on a first surface (e.g., an upper surface) of a circuit board, and the second memory IC is located on a second surface (e.g., a lower surface) of the circuit board. In other words, the first memory IC may be a top memory device, while the second memory IC may be a bottom memory device (e.g., in a clamshell configuration). For some examples, the shared conductor may be a shared via disposed in the circuit board between the first surface and the second surface.

According to some examples, the first and second memory ICs each comprise a double data rate, fourth generation (DDR4) synchronous dynamic random-access memory (SDRAM) IC. In this case, as an example, the shared conductor may be for bank address bit 0 (BA0) for the first memory IC and for bank address bit 1 (BA1) for the second memory IC.

According to some examples, the operations 700 may further involve the apparatus outputting another address signal to another shared conductor coupled to a third memory IC and to a fourth memory IC. For some examples, the first select signal indicates whether the other address signal applies to the third memory IC, and the second select signal indicates whether the other address signal applies to the fourth memory IC.

According to some examples, the operations 700 may further include the apparatus outputting a plurality of address signals to a plurality of shared conductors, each shared conductor coupled to the first memory IC and to the second memory IC. For some examples, the first select signal indicates whether the plurality of address signals applies to the first memory IC, and the second select signal indicates whether the plurality of address signals applies to the second memory IC.

According to some examples, the operations 700 may further involve the apparatus performing memory initialization of the plurality of memory ICs by sequentially outputting the first select signal and the second select signal.

As described above, another example of the present disclosure is a circuit board. The circuit board generally includes a first plurality of conductor pads arranged for a first memory IC, wherein the first plurality of conductor pads is located on a first surface of the circuit board; a second plurality of conductor pads arranged for a second memory IC, wherein the second plurality of conductor pads is located on a second surface of the circuit board; a first set of one or more shared vias, wherein each shared via is coupled to at least one of the first plurality of conductor pads, to at least one of the second plurality of conductor pads, and to a first trace for receiving an address signal; a second trace coupled to the first plurality of conductor pads for receiving a first select signal for indicating that the address signal applies to the first memory IC; and a third trace coupled to the second plurality of conductor pads for receiving a second select signal for indicating that the address signal applies to the second memory IC.

According to some examples, the circuit board further includes a third plurality of conductor pads arranged for a third memory IC, wherein the third plurality of conductor pads is located on the first surface of the circuit board; a fourth plurality of conductor pads arranged for a fourth memory IC, wherein the fourth plurality of conductor pads is located on the second surface of the circuit board; and a second set of one or more shared vias, wherein each shared via in the second set is coupled to at least one of the third plurality of conductor pads, to at least one of the fourth plurality of conductor pads, and to a fourth trace for receiving another address signal. For some examples, the second trace is coupled to the third plurality of conductor pads for receiving the first select signal for indicating the other address signal applies to the third memory IC; and the third trace is coupled to the fourth plurality of conductor pads for receiving the second select signal for indicating the other address signal applies to the fourth memory IC. For other examples, additional traces are coupled to the third plurality and the fourth plurality of conductor pads for receiving third and fourth select signals, respectively, different from the first and second select signals.

According to some examples, the circuit board is for a clamshell memory module.

According to some examples, the first and second plurality of conductor pads are each arranged for an SDRAM IC. For some examples, the first and second plurality of conductor pads are each arranged for a DDR4 SDRAM IC; a first one of the shared vias is for address bit 2 (A2) for the first memory IC and for address bit 9 (A9) for the second memory IC; and a second one of the shared vias is for A9 for the first memory IC and for A2 for the second memory IC.

Yet another example of the present disclosure is an apparatus. The apparatus generally includes a circuit board having a first surface and a second surface, a first memory IC located adjacent the first surface, and a second memory IC located adjacent the second surface. The circuit board generally includes a first set of one or more shared vias, wherein each shared via is coupled to the first memory IC, to the second memory IC, and to a first trace for receiving an address signal; a second trace coupled to the first memory IC for receiving a first select signal for indicating that the address signal applies to the first memory IC; and a third trace coupled to the second memory IC for receiving a second select signal for indicating that the address signal applies to the second memory IC.

According to some examples, the apparatus further includes a memory controller configured to output the address signal for each shared via, the first select signal, and the second select signal.

According to some examples, the apparatus further includes a third memory IC located adjacent the first surface of the circuit board and a fourth memory IC located adjacent the second surface of the circuit board. In this case, the circuit board may further include a second set of one or more shared vias, wherein each shared via in the second set is coupled to the third memory IC, to the fourth memory IC, and to a fourth trace for receiving another address signal. For some examples, the second trace may be coupled to the third memory IC for receiving the first select signal for indicating the other address signal applies to the third memory IC, and the third trace may be coupled to the fourth memory IC for receiving the second select signal for indicating the other address signal applies to the fourth memory IC.

According to some examples, the first and second memory ICs each comprise an SDRAM IC. In this case, the first and second memory ICs may each comprise a DDR3 SDRAM IC; a first one of the shared vias is for address bit 1 (A1) for the first memory IC and for address bit 2 (A2) for the second memory IC; and a second one of the shared vias is for A2 for the first memory IC and for A1 for the second memory IC.

According to some examples, the apparatus comprises a clamshell memory module.

As used herein (including the claims that follow), a phrase referring to "at least one of" a list of items refers to any combination of those items, including single members. As an example, "at least one of: x, y, and z" is intended to cover: x, y, z, x-y, x-z, y-z, x-y-z, and any combination thereof (e.g., x-y-y and x-x-y-z).

While the foregoing is directed to examples of the present disclosure, other and further examples of the disclosure may be devised without departing from the basic scope thereof, and the scope thereof is determined by the claims that follow.

What is claimed is:

1. A circuit board comprising:
   a first plurality of conductor pads arranged for a first memory integrated circuit (IC), wherein the first plurality of conductor pads is located on a first surface of the circuit board;
   a second plurality of conductor pads arranged for a second memory IC, wherein the second plurality of conductor pads is located on a second surface of the circuit board;
   a first set of one or more shared vias, wherein:
      each shared via is coupled to at least one of the first plurality of conductor pads, to at least one of the second plurality of conductor pads, and to a first trace for receiving an address signal; and
      at least one shared via in the first set of one or more shared vias is for a first address bit for the first memory IC and for a second address bit for the second memory IC, the second address bit being different from the first address bit;
   a second trace coupled to the first plurality of conductor pads for receiving a first select signal for indicating that the address signal applies to the first memory IC; and
   a third trace coupled to the second plurality of conductor pads for receiving a second select signal for indicating that the address signal applies to the second memory IC.

2. The circuit board of claim 1, further comprising:
   a third plurality of conductor pads arranged for a third memory IC, wherein the third plurality of conductor pads is located on the first surface of the circuit board;
   a fourth plurality of conductor pads arranged for a fourth memory IC, wherein the fourth plurality of conductor pads is located on the second surface of the circuit board; and
   a second set of one or more shared vias, wherein each shared via in the second set is coupled to at least one of the third plurality of conductor pads, to at least one of the fourth plurality of conductor pads, and to a fourth trace for receiving another address signal.

3. The circuit board of claim 2, wherein:
the second trace is coupled to the third plurality of conductor pads for receiving the first select signal for indicating the other address signal applies to the third memory IC; and
the third trace is coupled to the fourth plurality of conductor pads for receiving the second select signal for indicating the other address signal applies to the fourth memory IC.

4. The circuit board of claim 1, wherein the circuit board is for a clamshell memory module.

5. The circuit board of claim 1, wherein the first and second plurality of conductor pads are each arranged for a synchronous dynamic random-access memory (SDRAM) IC.

6. The circuit board of claim 5, wherein:
the first and second plurality of conductor pads are each arranged for a double data rate, fourth generation (DDR4) SDRAM IC;
a first one of the shared vias is for address bit 2 (A2) for the first memory IC and for address bit 9 (A9) for the second memory IC; and
a second one of the shared vias is for A9 for the first memory IC and for A2 for the second memory IC.

7. An apparatus comprising:
a circuit board having a first surface and a second surface;
a first memory integrated circuit (IC) located adjacent the first surface; and
a second memory IC located adjacent the second surface, wherein the circuit board comprises:
  a first set of one or more shared vias, wherein:
    each shared via is coupled to the first memory IC, to the second memory IC, and to a first trace for receiving an address signal; and
    at least one shared via in the first set of one or more shared vias is for a first address bit for the first memory IC and for a second address bit for the second memory IC, the second address bit being different from the first address bit;
  a second trace coupled to the first memory IC for receiving a first select signal for indicating that the address signal applies to the first memory IC; and
  a third trace coupled to the second memory IC for receiving a second select signal for indicating that the address signal applies to the second memory IC.

8. The apparatus of claim 7, further comprising a memory controller configured to output the address signal for each shared via, the first select signal, and the second select signal.

9. The apparatus of claim 7, further comprising:
a third memory IC located adjacent the first surface of the circuit board; and
a fourth memory IC located adjacent the second surface of the circuit board; wherein:
  the circuit board further comprises a second set of one or more shared vias; and
  each shared via in the second set is coupled to the third memory IC, to the fourth memory IC, and to a fourth trace for receiving another address signal.

10. The apparatus of claim 9, wherein:
the second trace is coupled to the third memory IC for receiving the first select signal for indicating the other address signal applies to the third memory IC; and
the third trace is coupled to the fourth memory IC for receiving the second select signal for indicating the other address signal applies to the fourth memory IC.

11. The apparatus of claim 7, wherein the first and second memory ICs each comprise a synchronous dynamic random-access memory (SDRAM) IC.

12. The apparatus of claim 11, wherein:
the first and second memory ICs each comprise a double data rate, third generation (DDR3) SDRAM IC;
a first one of the shared vias is for address bit 1 (A1) for the first memory IC and for address bit 2 (A2) for the second memory IC; and
a second one of the shared vias is for A2 for the first memory IC and for A1 for the second memory IC.

13. The apparatus of claim 7, wherein the apparatus comprises a clamshell memory module.

14. A method of addressing a plurality of memory integrated circuits (ICs), comprising:
outputting a first select signal to a first memory IC; and
outputting an address signal to a shared conductor coupled to the first memory IC and to a second memory IC, wherein:
  the shared conductor is for a first address bit for the first memory IC and for a second address bit for the second memory IC, the second address bit being different from the first address bit;
  the first select signal indicates whether the address signal applies to the first memory IC; and
  a second select signal indicates whether the address signal applies to the second memory IC.

15. The method of claim 14, further comprising:
outputting the second select signal to the second memory IC; and
outputting another address signal to the shared conductor, wherein the second select signal indicates whether the other address signal applies to the second memory IC.

16. The method of claim 14, wherein:
the first memory IC is located on a first surface of a circuit board;
the second memory IC is located on a second surface of the circuit board; and
the shared conductor comprises a shared via disposed in the circuit board between the first surface and the second surface.

17. The method of claim 14, wherein:
the first and second memory ICs each comprise a double data rate, fourth generation (DDR4) synchronous dynamic random-access memory (SDRAM) IC; and
the shared conductor is for bank address bit 0 (BA0) for the first memory IC and for bank address bit 1 (BA1) for the second memory IC.

18. The method of claim 14, further comprising outputting another address signal to another shared conductor coupled to a third memory IC and to a fourth memory IC, wherein the first select signal indicates whether the other address signal applies to the third memory IC and wherein the second select signal indicates whether the other address signal applies to the fourth memory IC.

19. The method of claim 14, further comprising outputting a plurality of address signals to a plurality of shared conductors, each shared conductor coupled to the first memory IC and to the second memory IC, wherein the first select signal indicates whether the plurality of address signals applies to the first memory IC and wherein the second select signal indicates whether the plurality of address signals applies to the second memory IC.

20. The method of claim 14, further comprising performing memory initialization of the plurality of memory ICs by sequentially outputting the first select signal and the second select signal.

* * * * *